United States Patent [19]
Thornton

[11] Patent Number: 6,167,241
[45] Date of Patent: *Dec. 26, 2000

[54] TECHNIQUE FOR PERFORMING AMPLITUDE MODULATION WITHOUT CHEATING SIDE-BANDS

[75] Inventor: Barry Thornton, Austin, Tex.

[73] Assignee: INT Labs, Inc., Austin, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/955,534

[22] Filed: Oct. 22, 1997

Related U.S. Application Data

[60] Provisional application No. 60/029,369, Oct. 28, 1996.

[51] Int. Cl.[7] ................................. H03C 3/00; H04B 1/68
[52] U.S. Cl. ........................... 455/109; 455/108; 455/47; 375/353
[58] Field of Search ...................... 455/108, 109, 455/114, 47; 375/353, 300, 301, 242; 332/115, 120, 149

[56] References Cited

U.S. PATENT DOCUMENTS

| | | | |
|---|---|---|---|
| 4,015,204 | 3/1977 | Miyazawa | 375/260 |
| 4,205,241 | 5/1980 | Fisher et al. | 332/115 |
| 4,213,095 | 7/1980 | Falconer | 375/332 |
| 4,716,397 | 12/1987 | Werba et al. | 341/160 |
| 5,260,980 | 11/1993 | Akagiri et al. | 375/241 |
| 5,404,379 | 4/1995 | Shyue et al. | 375/354 |
| 5,857,003 | 1/1999 | Geiger et al. | 375/319 |

OTHER PUBLICATIONS

Leon W. Couch II, Digital and Analog Communication Systems, Third edition, Macmillan Publishing Company, pp. 122–129, 1989.

*Primary Examiner*—Nay Maung
*Assistant Examiner*—Sonny Trinh
*Attorney, Agent, or Firm*—Haynes and Boone LLP

[57] ABSTRACT

A technique for amplitude modulating a carrier without producing side-bands is disclosed. In a preferred embodiment, a signal carrier is directly modulated and no energy side-bands are produced. This is accomplished by amplitude quantizing the data or information to be transmitted at the carrier rate or frequency and then resetting the amplitude of the carrier during one of the two 0-crossing times for each cycle of the carrier.

9 Claims, 2 Drawing Sheets

TECHNIQUE FOR PERFORMING AMPLITUDE MODULATION WITHOUT CHEATING SIDE-BANDS

CROSS-REFERENCE TO RELATED APPLICATION

This application claims the benefit of U.S. Provisional Patent Application Ser. No. 60/029,369, filed on Oct. 28, 1996, which is hereby incorporated by reference in its entirety.

TECHNICAL FIELD

The invention relates generally to radio frequency communications and, more particularly, to a technique for amplitude modulating a carrier without producing side-band energy.

BACKGROUND OF THE INVENTION

In radio frequency ("RF") transmission systems that utilize amplitude modulation ("AM") techniques to transmit information, an audio signal containing the information is used to modulate the amplitude of an RF carrier signal. Currently, amplitude modulation is performed by translating the frequency components of the audio signal to occupy a different position in the frequency spectrum. This is accomplished by multiplying a time-variant function that describes the carrier, typically an RF sine wave, with a modulation signal, typically containing some useful data or information and having no frequency components greater than one-half the carrier frequency. Multiplying one sinusoidal waveform (A sin $w_A$t) by another (B sin $w_B$t) results in an output frequency composition that may be represented by the following equation:

$$A \sin w_A t * B \sin w_B t = (AB/2)[\cos(w_A - w_B)t - \cos(w_A + w_B)t] \quad (1)$$

Half of the output power ("Power$_{out}$") is at a frequency equal to the sum of the carrier and the modulation signal. The other half is at a frequency equal to the difference in the frequencies. Therefore, the output power may be represented by the following equation:

$$\text{Power}_{out} = \tfrac{1}{2}g(f+c) + \tfrac{1}{2}g(f-c) \quad (2)$$

where g(f) is the modulation signal and c is the carrier signal. This result is represented graphically in FIG. 1A.

In practice, the process of amplitude modulation is enhanced by adding a DC component to the modulation signal, which results in the addition of the carrier, at a constant level $A_0$, to the output spectrum. This spectrum may be represented by the following equation:

$$A_0 + [(A \sin w_A)*(B \sin w_C)] = A_0 \cos w_C + AB/2[\cos(w_A - w_C) - \cos(w_A + w_C)] \quad (3)$$

Again, the sum and difference signals are equal, but now there is also power allocated to the carrier. Therefore, the output power may be represented by the following equation:

$$\text{Power}_{out} = A_0 c + \tfrac{1}{2}g(f+c) + \tfrac{1}{2}g(f-c) \quad (4)$$

where g(f) is the modulation signal and $A_0$c is the carrier signal. This result is illustrated graphically in FIG. 1B.

All of this occurs because the modulation process is continuous; that is, at all angles of the carrier's cycle, its amplitude is being modulated. This is what creates the side-bands g(f−c) and g(f+c).

The amplitude modulation process described above suffers from several deficiencies. In particular, the bandwidth needed is typically twice the bandwidth of the modulation signal and, at best, equal to the bandwidth of the modulation signal. Moreover, a portion of the energy of the output signal contains no modulation. Of all the energy employed, only a limited amount actually carries information and the remainder is unused.

Therefore, what is needed is a technique for amplitude modulating that remedies the deficiencies of the prior art as described above.

SUMMARY OF THE INVENTION

In a preferred embodiment, the invention comprises a technique for amplitude modulating a carrier without producing side-bands. In a preferred embodiment, a signal carrier is directly modulated and no energy side-bands are produced. This is accomplished by amplitude quantizing the data or information to be transmitted at the carrier rate or frequency and then resetting the amplitude of the carrier during one of the two 0-crossing times for each cycle of the carrier.

A technical advantage achieved with the present invention is that the reduction of the bandwidth of the transmission channel results in the ability to pack more transmission channels into a given frequency bandwidth.

Another technical advantage achieved with the invention is that more of the carrier energy is used in the data transmission process, resulting in greater and more reliable transmission range.

Yet another technical advantage achieved with the invention is that the narrow-band character of the signal and the necessary receiver reduces the susceptibility of signals modulated using the technique to medium noise.

Still another technical advantage achieved with the invention is that, when combined with modulated side-bands, the technique offers an additional independent data channel for data intensification or transmission of control information for such applications as digital audio overlaid on AM stereo radio.

DETAILED DESCRIPTION OF THE PREFERRED EMBODIMENT

Figure 1A:
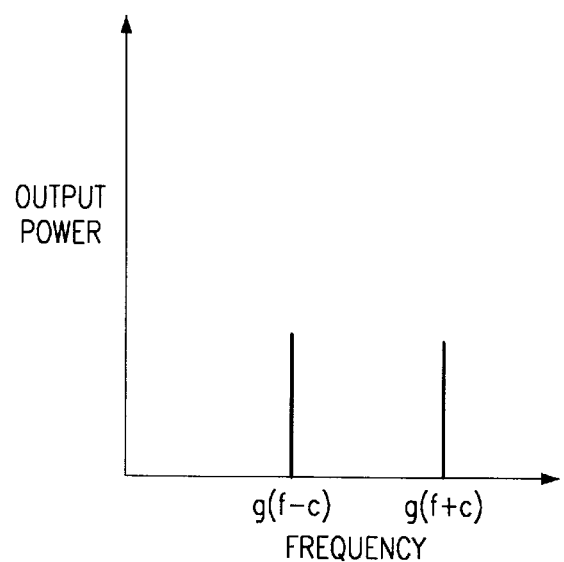
FIGS. 1A and 1B illustrate a prior art AM technique resulting in the generation of side-bands.
Figure 1B:
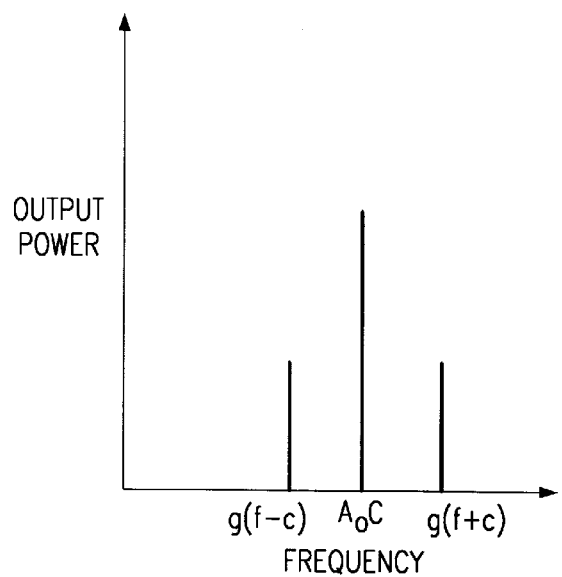
Figure 3:
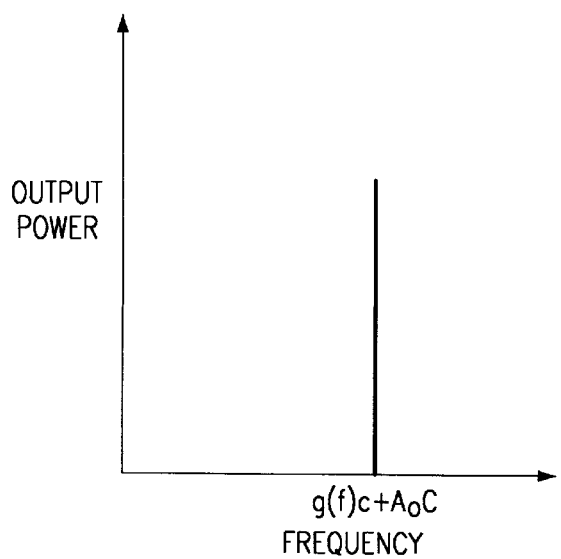
FIG. 3 illustrates the energy spectrum of the improved AM technique of the present invention.
Figure 2A:
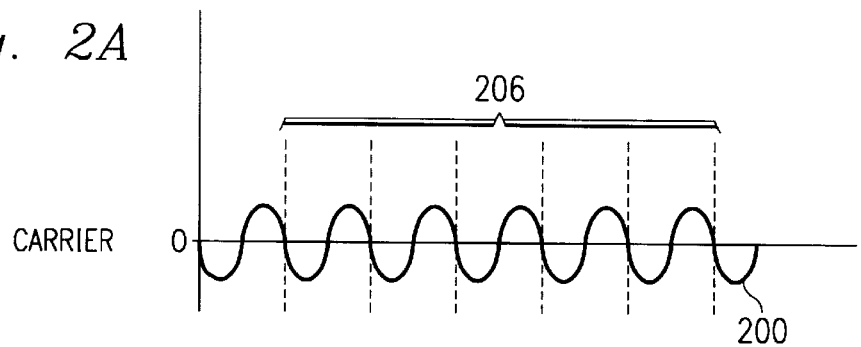
FIG. 2 illustrates the improved AM technique of the present invention.
Figure 2B:
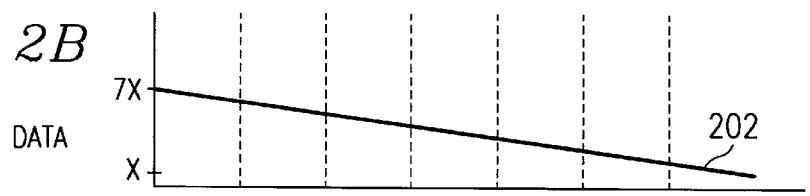
Figure 2C:
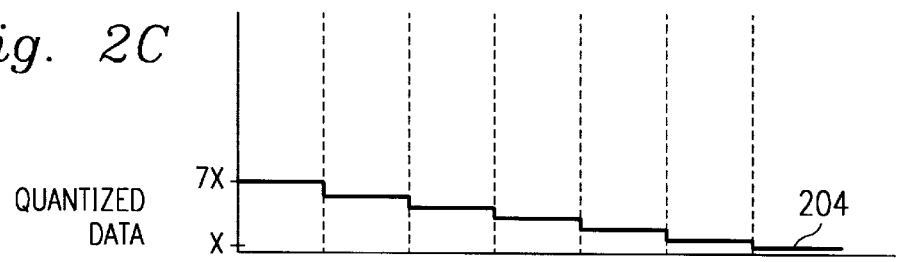
Figure 2D:
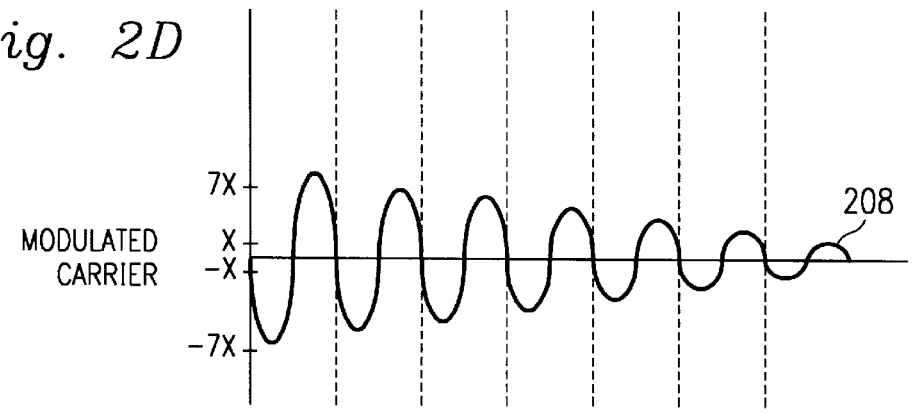

FIGS. 1A and 1B illustrate a common prior art AM technique that results in the generation of side-bands, as discussed above.

FIG. 2 illustrates the technique of the present invention for amplitude modulating a carrier, shown in FIG. 2 as a sine wave 200, without creating side-bands. The technique is conceptually implemented in two steps. First, data 202 is amplitude quantized at the rate, or frequency, of the carrier 200 to produce a quantized data signal 204. The carrier 200 is then amplitude modulated by resetting the amplitude of the carrier 200 during one of the two 0-crossing times 206 for each cycle of the carrier to the amplitude of the quantized data signal 204 during that cycle to produce a modulated carrier 208.

Because the change in amplitude takes place at 0-crossing times 206, when there is no signal present, two phenomena occur. First, the modulated carrier 208 remains a sine function (or at least as clean a sine function as an be generated), as no modulation change occurs during a cycle itself. As a result, there is no non-linear condition to produce the inter-modulation distortion characteristic that results in modulation side-bands. The modulated carrier 208 is a series of continuous and contiguous sine pulses, each of fixed amplitude. Second, the modulated carrier 208 contains all of the necessary modulation information. The entire modulated carrier 208 can be us ed for this purpose.

Referring again to equation (3) above, $A \sin w_A$ becomes simply A, so that the left side of equation (3) becomes:

$$AB \sin w_C \qquad (5)$$

There are no sum and/or difference elements; all of the modulation B is in the carrier. Therefore, the output power may be represented by the following equation:

$$\text{Power}_{out} = A_0 c + g(f)c \qquad (6)$$

where $A_0 c$ is the carrier 200 and $g(f)c$ is the modulated carrier 208. This result is graphically illustrated in FIG. 4.

The unique characteristics of this technique are that, with the elimination of the side-bands as the information carrier components of the transmission, all of the information transfer occurs at the carrier frequency. Accordingly, the bandwidth of the transmission is reduced to that of the bandwidth of the carrier.

Although an illustrative embodiment of the invention has been shown and described, other modifications, changes, and substitutions are intended in the foregoing disclosure. Accordingly, it is appropriate that the appended claims be construed broadly and in a manner consistent with the scope of the invention.

What is claimed is:

1. A method for amplitude modulating a carrier signal, the method comprising steps of:

providing a carrier signal having a frequency and a data signal to be carried by said carrier signal;

amplitude quantizing said data signal at said frequency of said carrier signal by dividing said data signal into a plurality of segments of equal duration and setting the amplitude of each one of said plurality of segments to a respective value, each one of said plurality of segments of said data signal having a corresponding segment of said carrier signal having the same duration; and modulating said carrier signal using said amplitude quantized data signal to produce an amplitude modulated carrier signal without side-bands.

2. The method of claim 1 wherein said modulating step comprises:

for each cycle of said carrier signal, resetting an amplitude of said carrier signal to an amplitude of said quantized data during said cycle, said resetting being performed only at one of two 0-crossing times of said carrier signal during said cycle.

3. The method of claim 1 wherein said carrier signal is sinusoidal.

4. The method of claim 1 wherein said modulated carrier signal is sinusoidal.

5. The method of claim 1 wherein said carrier signal is a radio frequency ("RF") signal.

6. A method for amplitude modulating a carrier signal, the method comprising steps of:

providing a carrier signal having a frequency and a data signal to be carried by said carrier signal:

amplitude quantizing said data signal at said frequency of said carrier signal by dividing said data signal into a plurality of segments of equal duration and setting the amplitude of each one of said plurality of segments to a respective value, each one of said plurality of segments of said data signal having a corresponding segment of said carrier signal having the same duration; and for each cycle of said carrier signal, resetting an amplitude of said carrier signal to a corresponding amplitude of said quantized data signal during said cycle;

wherein resetting is performed only at one of two 0-crossing times of said carrier signal during said cycle.

7. The method of claim 6 wherein said carrier signal is sinusoidal.

8. The method of claim 6 wherein said modulated carrier signal is sinusoidal.

9. The method of claim 6 wherein said carrier signal is a radio frequency ("RF") signal.

* * * * *